US011848506B2

(12) United States Patent
Li

(10) Patent No.: US 11,848,506 B2
(45) Date of Patent: Dec. 19, 2023

(54) ANTENNA APPARATUS AND ELECTRONIC DEVICE

(71) Applicant: GUANGDONG OPPO MOBILE TELECOMMUNICATIONS CORP., LTD., Dongguan (CN)

(72) Inventor: Si Li, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 184 days.

(21) Appl. No.: 17/681,124

(22) Filed: Feb. 25, 2022

(65) Prior Publication Data

US 2022/0181779 A1    Jun. 9, 2022

Related U.S. Application Data

(63) Continuation of application No. PCT/CN2020/110833, filed on Aug. 24, 2020.

(30) Foreign Application Priority Data

Aug. 30, 2019    (CN) .......................... 201910818039.7

(51) Int. Cl.
    *H01Q 1/36* (2006.01)
    *H01Q 7/00* (2006.01)
    (Continued)

(52) U.S. Cl.
    CPC ................. *H01Q 7/00* (2013.01); *H01Q 1/48* (2013.01); *H03H 7/0115* (2013.01); *H03H 7/38* (2013.01)

(58) Field of Classification Search
    CPC ............ H01Q 7/00; H01Q 1/48; H01Q 1/243; H01Q 1/521; H01Q 21/28; H01Q 1/36;
    (Continued)

(56) References Cited

U.S. PATENT DOCUMENTS 11,038,257 B2 *  6/2021  Zhu ........................ H01Q 1/243
2009/0160713 A1 *  6/2009  Nielsen ................ H01Q 9/0442
                                                        343/702
(Continued)

FOREIGN PATENT DOCUMENTS

CN        105742782 A        7/2016
CN        205509000 U        8/2016
(Continued)

OTHER PUBLICATIONS

The supplementary European search report dated Oct. 13, 2022 from European patent Application No. 20858604.0.
(Continued)

*Primary Examiner* — Graham P Smith
*Assistant Examiner* — Bamidele A Immanuel
(74) *Attorney, Agent, or Firm* — BAYES PLLC

(57) ABSTRACT

An antenna apparatus and an electronic device, the antenna apparatus comprising: a near-field communication chip for providing a differential excitation current; a first non-near-field communication chip for providing a first non-near-field communication excitation signal; a grounding plane on which a conductive path is formed; a first conductor structure, comprising a first conductor section and a second conductor section spaced apart from each other; and a second conductor structure.

20 Claims, 7 Drawing Sheets

(51) Int. Cl.
*H01Q 1/48* (2006.01)
*H03H 7/01* (2006.01)
*H03H 7/38* (2006.01)

(58) Field of Classification Search
CPC .. H01Q 1/22; H01Q 1/38; H01Q 1/50; H03H 7/0115; H03H 7/38; H04B 5/0031; H04B 5/0081; H04B 5/02
See application file for complete search history.

(56) References Cited

U.S. PATENT DOCUMENTS

| | | | | |
|---|---|---|---|---|
| 2013/0017781 A1* | 1/2013 | Jones | | H01Q 1/243 |
| | | | | 455/90.3 |
| 2013/0307740 A1* | 11/2013 | Pajona | | H01Q 5/307 |
| | | | | 343/866 |
| 2014/0139380 A1* | 5/2014 | Ouyang | | H01Q 5/314 |
| | | | | 343/702 |
| 2014/0266922 A1* | 9/2014 | Jin | | H01Q 1/243 |
| | | | | 343/702 |
| 2014/0347233 A1* | 11/2014 | Mahanfar | | H01Q 1/521 |
| | | | | 343/720 |
| 2015/0249292 A1* | 9/2015 | Ouyang | | H01Q 7/00 |
| | | | | 343/702 |
| 2016/0190693 A1* | 6/2016 | Wu | | H04B 1/3827 |
| | | | | 343/870 |
| 2016/0241306 A1* | 8/2016 | Moon | | H04B 5/0075 |
| 2016/0315373 A1* | 10/2016 | Azad | | H01Q 1/48 |
| 2016/0380337 A1* | 12/2016 | Lee | | H01Q 1/243 |
| | | | | 343/702 |
| 2017/0264721 A1* | 9/2017 | Yli-Peltola | | H01Q 1/243 |
| 2017/0338541 A1* | 11/2017 | Tsai | | H01Q 7/00 |
| 2018/0145398 A1* | 5/2018 | Lilja | | H01Q 5/364 |
| 2018/0331416 A1* | 11/2018 | Yu | | H01Q 5/314 |
| 2019/0198996 A1* | 6/2019 | Zhu | | H01Q 5/50 |
| 2019/0229397 A1* | 7/2019 | Rizzo | | H05K 9/0022 |

FOREIGN PATENT DOCUMENTS

| | | |
|---|---|---|
| CN | 105940550 A | 9/2016 |
| CN | 107403995 A | 11/2017 |
| CN | 108288765 A | 7/2018 |
| CN | 105870595 B | 5/2019 |
| WO | 2018148973 A1 | 8/2018 |

OTHER PUBLICATIONS

The Second Office Action dated Feb. 28, 2022 from Chinese Application No. 201910818039.7, 9 pages.
The Notice of Allowance dated Apr. 20, 2022 from Chinese Application No. 201910818039.7, 4 pages.
International Search Report and the Written Opinion dated Nov. 19, 2020 From the International Searching Authority Re. Application No. PCT/CN2020/110833, 11 pages.
The first Office Action dated Oct. 22, 2021 from from China Application No. 201910818039.7, 16 pages.

* cited by examiner

ANTENNA APPARATUS AND ELECTRONIC DEVICE

CROSS REFERENCE TO RELATED APPLICATIONS

This application is a continuation of International Application No. PCT/CN2020/110833, filed on Aug. 24, 2020, which claims priority of Chinese Patent Application No. 201910818039.7, filed on Aug. 30, 2019, entitled "ANTENNA APPARATUS AND ELECTRONIC DEVICE, the entire contents of which are incorporated herein by reference in their entireties.

BACKGROUND OF DISCLOSURE

Field of the Disclosure

The present disclosure relates to the technical field of communication, and more specifically to an antenna apparatus and an electronic device.

Description of the Related Art

With development of communication technology, electronic devices such as smartphones can realize more and more functions, and the communication modes of electronic devices are also more diversified.

For example, a common electronic device may support cellular network communication, wireless fidelity (Wi-Fi) communication, global positioning system (GPS) communication, Bluetooth (BT) communication, and other communication modes.

In addition, with advancement of communication technology, recent electronic devices can gradually realize near-field communication (NFC).

SUMMARY

Embodiments of the present disclosure provide an antenna apparatus and an electronic device.

In a first aspect, an embodiment of the present disclosure provides an antenna apparatus which includes:
  a near-field communication chip including a first differential-signal terminal and a second differential-signal terminal, wherein the first differential-signal terminal and the second differential-signal terminal are configured to provide a differential excitation current;
  a first non-near-field communication chip used to provide a first non-near-field communication excitation signal;
  a grounding plane including a first grounding point and a second grounding point disposed apart from each other, wherein the grounding plane forms a conductive path between the first grounding point and the second grounding point;
  a first conductor structure including a first conductor segment and a second conductor segment disposed apart from each other, wherein the first conductor segment is electrically connected to the second conductor segment through a first isolation circuit, the first conductor segment is provided with a first feeding terminal, the first feeding terminal is electrically connected to the first differential-signal terminal, the second conductor segment is provided with a third feeding terminal and a first grounding terminal, the third feeding terminal is connected to the first non-near-field communication chip, and the first grounding terminal is electrically connected to the first grounding point;
  a second conductor structure including a second feeding terminal and a second grounding terminal disposed apart from each other, wherein the second feeding terminal is electrically connected to the second differential-signal terminal, and the second grounding terminal is electrically connected to the second ground point;
  wherein the first conductor structure, the conductive path, and the second conductor structure jointly form a first conductive loop for transmitting the differential excitation current, the second conductor segment further forms a second conductive loop for transmitting the first non-near-field communication excitation signal, the first isolation circuit is used to implement isolation between the differential excitation current transmitted through the first conductive loop and the first non-near-field communication excitation signal transmitted through the second conductive loop.

In a second aspect, an embodiment of the present disclosure provides an electronic device including an antenna apparatus, wherein the antenna apparatus includes:
  a near-field communication chip including a first differential-signal terminal and a second differential-signal terminal, wherein the first differential-signal terminal and the second differential-signal terminal are configured to provide a differential excitation current;
  a first non-near-field communication chip used to provide a first non-near-field communication excitation signal;
  a grounding plane including a first grounding point and a second grounding point disposed apart from each other, wherein the grounding plane forms a conductive path between the first grounding point and the second grounding point;
  a first conductor structure including a first conductor segment and a second conductor segment disposed apart from each other, wherein the first conductor segment is electrically connected to the second conductor segment through a first isolation circuit, the first conductor segment is provided with a first feeding terminal, the first feeding terminal is electrically connected to the first differential-signal terminal, the second conductor segment is provided with a third feeding terminal and a first grounding terminal, the third feeding terminal is connected to the first non-near-field communication chip, and the first grounding terminal is electrically connected to the first grounding point;
  a second conductor structure including a second feeding terminal and a second grounding terminal disposed apart from each other, wherein the second feeding terminal is electrically connected to the second differential-signal terminal, and the second grounding terminal is electrically connected to the second ground point;
  wherein the first conductor structure, the conductive path, and the second conductor structure jointly form a first conductive loop for transmitting the differential excitation current, the second conductor segment further forms a second conductive loop for transmitting the first non-near-field communication excitation signal, the first isolation circuit is used to implement isolation between the differential excitation current transmitted through the first conductive loop and the first non-near-field communication excitation signal transmitted through the second conductive loop.

BRIEF DESCRIPTION OF DRAWINGS

To illustrate the technical solutions in the embodiments of the present disclosure more clearly, the accompanying drawings that need to be used in the description of the embodiments will be briefly introduced as follows. Obviously, the drawings in the following description are only some embodiments of the present disclosure, and other drawings can also be obtained from these drawings without creative effort by those skilled in the art.

DETAILED DESCRIPTION OF EMBODIMENTS

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative work fall within the protection scope of the present disclosure.

Embodiments of the present disclosure provide an electronic device. The electronic device may be a device such as a smartphone and a tablet computer, and may also be a game device, an AR (Augmented Reality) device, a car device, a data storage device, an audio playback device, a video playback device, a notebook computer, a desktop computing device, or the like.

Figure 1:
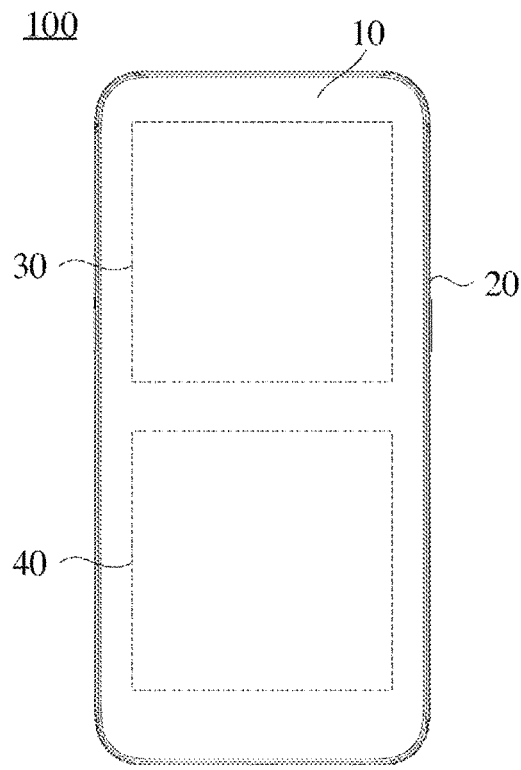
FIG. 1 is a schematic structural diagram of an electronic device provided by an embodiment of the present disclosure.

Referring to FIG. 1, which is a schematic structural diagram of an electronic device 100 according to an embodiment of the present disclosure.

The electronic device 100 includes a display screen 10, a housing 20, a circuit board 30, and a battery 40.

The display screen 10 is disposed on the housing 20 to form a display surface of the electronic device 100 for displaying information such as images and texts. The display screen 10 may include a liquid crystal display (LCD) or organic light-emitting diode (OLED) type display screen.

It can be understood that the display screen 10 may include a display surface and a non-display surface opposite to the display surface. The display surface is a surface of the display screen 10 facing a user. Namely, the surface of the display screen 10 is visible to the user and located on the electronic device 100. The non-display surface is a surface of the display screen 10 facing the interior of the electronic device 100. The display surface is used for displaying information, and the non-display surface does not display information.

It can be understood that a cover plate may also be provided on the display screen 10 to protect the display screen 10 and prevent the display screen 10 from being scratched or damaged by water. The cover plate may be a transparent-glass cover plate, so that the user can observe the content displayed on the display screen 10 through the cover plate. It can be understood that the cover plate may be a glass cover plate made of sapphire.

The housing 20 is used to form an outer contour of the electronic device 100 so as to accommodate electronic components, functional components, and the like of the electronic device 100. Meanwhile, the housing 20 provides sealing and protecting functions on the electronic device and functional components inside the electronic device.

For example, a camera, a circuit board, a vibration motor, and other functional components of the electronic device 100 may be arranged inside the housing 20. It can be understood that the housing 20 may include a middle frame and a battery cover.

The middle frame may be a thin-plate-like or flake-like structure, and may also be a hollow frame structure. The middle frame is used to provide support for the electronic components or functional components in the electronic device 100, so as to mount the electronic components and functional components of the electronic device 100 together.

For example, the middle frame may be provided with structures such as grooves, protrusions, through holes, and the like, so as to facilitate an installation of electronic components or functional components of the electronic device 100. It can be understood that a material of the middle frame may include a metal or plastic material.

The battery cover is connected to the middle frame. For example, the battery cover may be attached to the middle frame by an adhesive such as double-sided tape to realize a connection with the middle frame. The battery cover is used together with the middle frame and the display screen 10 to seal the electronic components and functional components of the electronic device 100 inside the electronic device 100 to protect the electronic components and functional components of the electronic device 100. It can be understood that the battery cover can be integrally formed. During a forming process of the battery cover, structures such as a rear camera mounting hole may be formed on the battery cover. It can be understood that a material of the battery cover may also include a metal or plastic material.

The circuit board 30 is arranged inside the housing 20. For example, the circuit board 30 may be mounted on the middle frame of the housing 20 for fixing, and the circuit board 30 is sealed inside the electronic device with the battery cover. The circuit board 30 may be a main board of the electronic device 100. The circuit board 30 may also integrate with one or more functional components such as a processor, a camera, an earphone interface, an acceleration sensor, a gyroscope, and a motor. Meanwhile, the display screen 10 may be electrically connected to the circuit board 30 to control a display function of the display screen 10 by a processor on the circuit board 30.

The battery 40 is disposed inside the housing 20. For example, the battery 40 may be mounted on the middle frame of the housing 20 for fixing, and the battery 40 is sealed inside the electronic device with the battery cover. Meanwhile, the battery 40 is electrically connected to the circuit board 30, so that the battery 40 can supply power to the electronic device 100. The circuit board 30 may be provided with a power management circuit. The power management circuit is used to distribute a voltage provided by the battery 40 to various electronic components in the electronic device 100.

The electronic device 100 is further provided with an antenna apparatus 200. The antenna apparatus 200 is used to implement a wireless communication function of the electronic device 100.

For example, the antenna apparatus 200 may be used to implement near-field communication (NFC). The antenna apparatus 200 is disposed inside the housing 20 of the electronic device 100. It can be understood that some components of the antenna apparatus 200 may be integrated on the circuit board 30 inside the housing 20.

For example, signal processing chips and signal processing circuits in the antenna apparatus 200 may be integrated on the circuit board 30.

In addition, some components of the antenna apparatus 200 may also be directly disposed inside the housing 20.

For example, a radiator or conductor structure of the antenna apparatus 200 for radiating signals can be directly disposed inside the housing 20.

Figure 2:
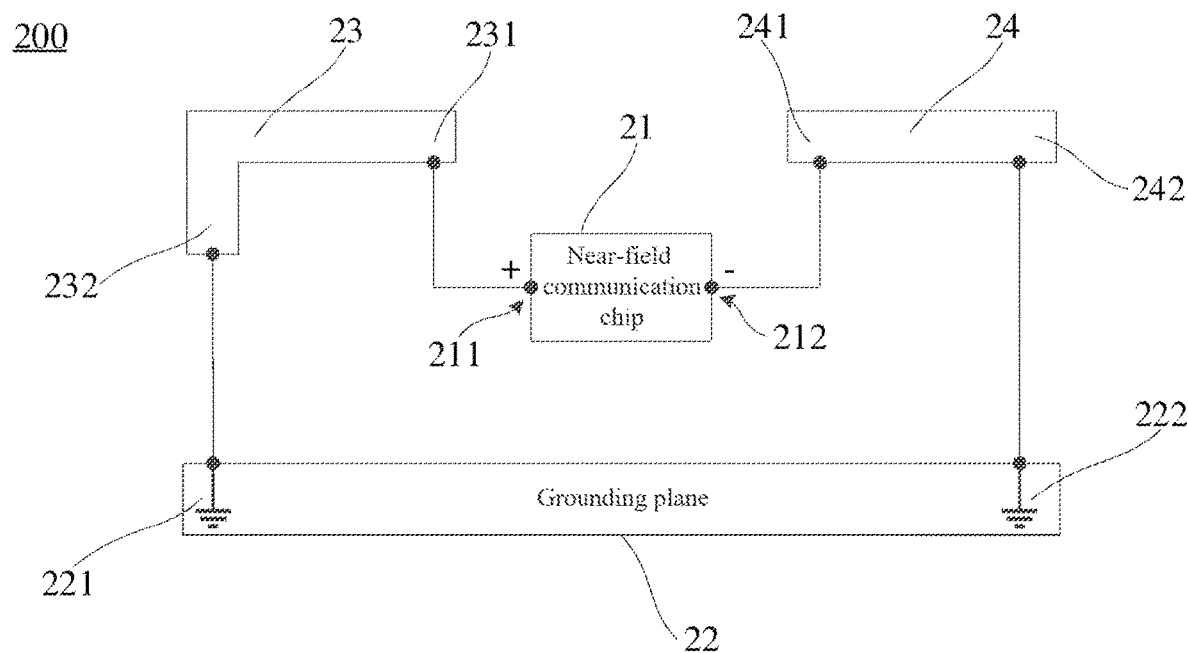
FIG. 2 is a schematic diagram of a first structure of an antenna apparatus provided by an embodiment of the present disclosure.

Referring to FIG. 2, which is a schematic diagram of a first structure of an antenna apparatus 200 according to an embodiment of the present disclosure. The antenna apparatus 200 includes a near-field communication chip 21, a grounding plane 22, a first conductor structure 23, and a second conductor structure 24.

In the description of the present disclosure, it should be understood that terms such as "first" and "second" are only used to distinguish similar objects, and cannot be interpreted as indicating or implying relative importance or implying a number of indicated technical features.

The near-field communication chip (NFC chip) 21 can be used to provide a differential excitation current. The differential excitation current includes two current signals. Amplitudes of the two current signals are the same and phases of the two current signals are inverted. Alternatively, it is understood that the phases of the two current signals differ by 180 degrees. Furthermore, the differential excitation current is a balanced signal. It is understandable that in a process of transmission, if an analog signal is directly transmitted, then the analog signal is an unbalanced signal; if the original analog signal is inverted, then the inverted analog signal and the original analog signal are transmitted at the same time, wherein the inverted analog signal and the original analog signal are called balanced signals. During the transmission process, the balanced signals pass through a differential amplifier, and the original analog signal is subtracted by the inverted analog signal to obtain the enhanced original analog signal. Because two transmission lines are subject to the same interference during the transmission process, the same interference signal is subtracted in a subtraction process, so the anti-interference performance of the balanced signals is better.

The NFC chip 21 includes a first differential-signal terminal 211 and a second differential-signal terminal 212.

For example, the first differential-signal terminal 211 may be a positive (+) port of the NFC chip 21, and the second differential-signal terminal 212 may be a negative (−) port of the NFC chip 21. The first differential-signal terminal 211 and the second differential-signal terminal 212 are used to provide the differential excitation current.

For example, the differential excitation current provided by the NFC chip 21 can be output to the antenna apparatus 200 via the first differential-signal terminal 211 and returned to the NFC chip 21 via the second differential-signal terminal 212, thereby forming a current loop.

It can be understood that the NFC chip 21 may be provided on the circuit board 30 of the electronic device 100. Alternatively, a smaller independent circuit board may also be provided in the electronic device 100, and the NFC chip 21 may be integrated on the independent circuit board. The independent circuit board may be, for example, a small board in the electronic device 100.

The grounding plane 22 is used to form a common ground. The grounding plane 22 may be formed by a conductor, a printed circuit, or a metal printed layer in the electronic device 100.

For example, the grounding plane 22 may be provided on the circuit board 30 of the electronic device 100. The grounding plane 22 may also be formed on the housing 20 of the electronic device 100.

For example, the grounding plane 22 may be formed by the middle frame of the housing 20. Alternatively, the grounding plane 22 may be formed by the battery cover of the housing 20.

The grounding plane 22 includes a first grounding point 221 and a second grounding point 222 disposed apart from each other. The first grounding point 221 and the second grounding point 222 may be, for example, terminals of the grounding plane 22, or may be protruding structures on the grounding plane 22, or may be pads formed on the grounding plane 22, or may also be a certain area on the grounding plane 22, and the like.

The grounding plane 22 forms a conductive path between the first grounding point 221 and the second grounding point 222, wherein the conductive path can be used to conduct current. Namely, when a voltage signal is applied between the first grounding point 221 and the second grounding point 222, a current can be generated between the first grounding point 221 and the second grounding point 222, thereby forming a current loop. It can be understood that when the NFC chip 21 provides the differential excitation current, the conductive path between the first grounding point 221 and the second grounding point 222 can be used to transmit the differential excitation current.

The first conductor structure 23 includes a first feeding terminal 231 and a first grounding terminal 232 which are disposed apart form each other. The first feeding terminal 231 is electrically connected to the first differential-signal terminal 211 of the NFC chip 21, so that the first differential-signal terminal 211 feeding power to the first power feeding terminal 231 is implemented.

For example, the differential excitation current provided by the NFC chip 21 can be transmitted to the first feeding terminal 231 via the first differential-signal terminal 211 to realize power feeding to the first conductor structure 23. The first grounding terminal 232 is electrically connected to the first grounding point 221 of the grounding plane 22, so as to realize a function of returning to the ground for the first conductor structure 23.

The second conductor structure 24 includes a second feed terminal 241 and a second grounding terminal 242 that are disposed apart from each other. The second feeding terminal 241 is electrically connected to the second differential-signal terminal 212 of the NFC chip 21, so that the second differential-signal terminal 212 feeding power to the second power feeding terminal 241 is implemented.

For example, the differential excitation current provided by the NFC chip 21 may be transmitted to the second differential-signal terminal 212 via the second feeding terminal 241 to realize power feeding to the second conductor structure 24. The second grounding terminal 242 is electrically connected to the second grounding point 222 of the grounding plane 22, so as to realize a function of returning to the ground for the ground return of the second conductor structure 24.

The first conductor structure 23 and the second conductor structure 24 may both be metal structures in the electronic device 100 or structures such as metal wiring on the circuit board 30. It should be noted that the second conductor structure 24 and the first conductor structure 23 are different conductor structures.

Figure 3:
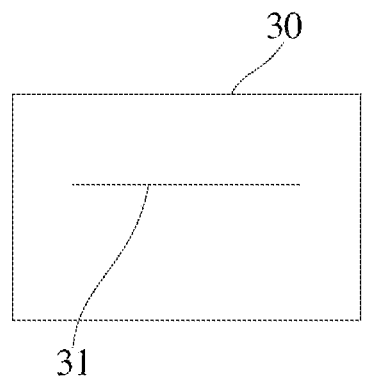
FIG. 3 is a schematic structural diagram of a circuit board of an electronic device according to an embodiment of the present disclosure.

For example, as shown in FIG. 3, that is a schematic structural diagram of a circuit board 30 of an electronic device provided by an embodiment of the present disclosure. The printed circuit 31 is provided on the circuit board 30 of the electronic device 100. The first conductor structure 23 may include the printed circuit 31, or the second conductor structure 24 may include the printed circuit 31.

Figure 4:
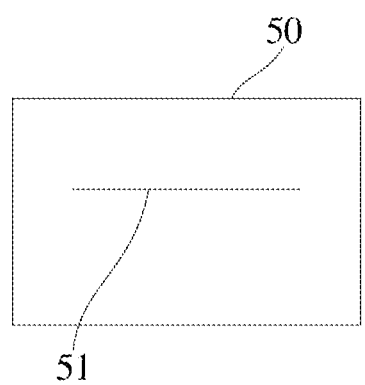
FIG. 4 is a schematic structural diagram of a flexible circuit board of an electronic device according to an embodiment of the present disclosure.

For another example, as shown in FIG. 4, that is a schematic structural diagram of a flexible circuit board 50 of an electronic device provided by an embodiment of the present disclosure. The electronic device 100 includes a flexible printed circuit (FPC) 50, and the FPC 50 is electrically connected to the circuit board 30. The FPC 50 may be, for example, an FPC of a display screen, an FPC of a camera, an FPC of a motor, or the like. Alternatively, the FPC 50 may be an independent FPC for realizing an NFC conductor structure, which may be fixed inside the housing of the electronic device 100. The FPC 50 is provided with metal wiring 51, and the metal wiring 51 is used to transmit signals, for example, the metal wiring 51 can be used to transmit control signals of a display screen, control signals of a camera, control signals of a motor, and the like. The first conductor structure 23 may include the metal wiring 51, or the second conductor structure 24 may include the metal wiring 51.

Figure 5:
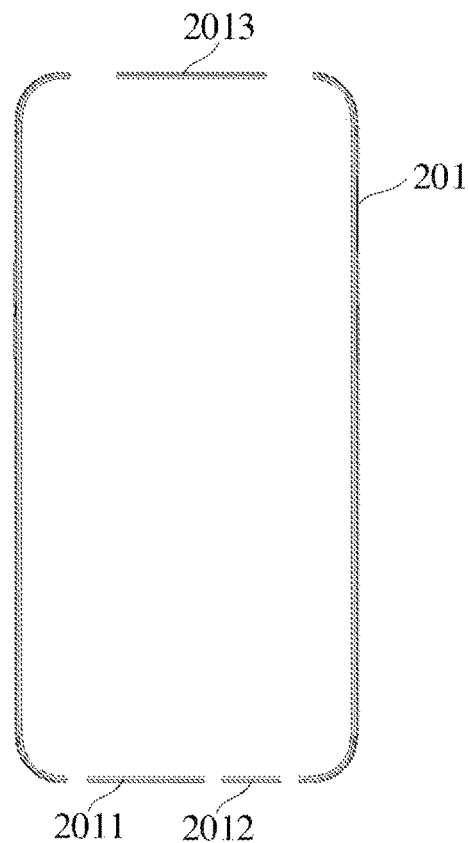
FIG. 5 is a schematic structural diagram of a middle frame of an electronic device according to an embodiment of the present disclosure.

For another example, as shown in FIG. 5, that is a schematic structural diagram of a middle frame 201 of an electronic device provided by an embodiment of the present disclosure. The housing 20 of the electronic device 100 includes a middle frame 201, and the circuit board 30 can be disposed on the middle frame 201. A plurality of slits can be formed on the middle frame 201, and a plurality of metal branches can be formed by the plurality of slits.

For example, a first metal branch 2011, a second metal branch 2012, and a third metal branch 2013 can be formed on the middle frame 201 by a plurality of slits. The first conductor structure 23 and the second conductor structure 24 may both be formed of metal branches.

For another example, the electronic device 100 may include a front camera and a rear camera, and a decorative ring of metal material may be provided around the front camera and the rear camera. The first conductor structure 23 may include a decorative ring for the front camera, and the second conductor structure 24 may include a decorative ring for the rear camera.

The first conductor structure 23, the conductive path on the grounding plane 22 and the second conductor structure 24 jointly form a first conductive loop for transmitting the differential excitation current. Namely, the differential excitation current is output from one signal terminal of the NFC chip 21, for example, output from the first differential-signal terminal 211, then fed into the first conductor structure 23, transmitted to the conductive path on the grounding plane 22 via the first conductor structure 23, then transmitted to the second conductor structure 24 via the conductive path, and finally flows back to the second differential-signal terminal 212 of the NFC chip 21 via the second conductor structure 24, thereby forming a complete current loop.

It can be understood that when the conductive loop transmits the differential excitation current, the first conductor structure 23, the conductive path on the ground plane 22, and the second conductor structure 24 can jointly generate an alternating electromagnetic field, so that the NFC signal is radiated outward to realize the NFC communication of the electronic device 100.

When the conductive loop transmits the differential excitation current, the first conductor structure 23 generates a first near-field-communication radiation field (first NFC radiation field). The first NFC radiation field may cover an area of a certain space around the electronic device 100. The second conductor structure 24 generates a second near-field-communication radiation field (second NFC radiation field). The second NFC radiation field may also cover an area of a certain space around the electronic device 100. The second NFC radiation field at least partially overlaps with the first NFC radiation field, so that the area of the NFC radiation field around the electronic device 100 can be enhanced, and the field strength of the overlapping area can be enhanced. Therefore, an effective read/write (card swipe) area of the NFC antenna of the electronic device 100 can be increased, and the stability of the NFC antenna of the electronic device 100 during read/write (card swipe) can be improved.

In addition, when the conductive loop transmits the differential excitation current, the grounding plane 22 may generate a third near-field-communication radiation field (third NFC radiation field). The third NFC radiation field may also cover an area of a certain space around the electronic device 100. The third NFC radiation field at least partially overlaps the first NFC radiation field and the third NFC radiation field at least partially overlaps the second NFC radiation field. Therefore, an area of the NFC radiation field around the electronic device 100 can be further enhanced, and the field strength of the overlapping area can be enhanced.

For example, in practical applications, when an NFC receiver (such as a subway card swiping machine) reads an NFC signal near the first conductor structure 23, the first NFC radiation field formed by the first conductor structure 23 serves as a main radiation field. All of the second NFC radiation field formed by the second conductor structure 24 and the third NFC radiation field formed by the grounding plane 22 can compensate the main radiation field, so that weaker positions in the main radiation field can be compensated to enhance the field strength over the entire area of the main radiation field. Similarly, when the NFC receiver reads the NFC signal at a position near the second conductor structure 24, the second NFC radiation field formed by the second conductor structure 24 is used as the main radiation field, and the first NFC radiation field, the third NFC radiation field can compensate the main radiation field.

Therefore, the antenna apparatus 200 of the present disclosure can ensure that in the electronic device 100, any position of the NFC radiation field formed by the first conductor structure 23, the second conductor structure 24, and the grounding plane 22 can realize that the NFC signal is sent and received, thereby realizing NFC communication between the electronic device 100 and other electronic devices.

Figure 6:
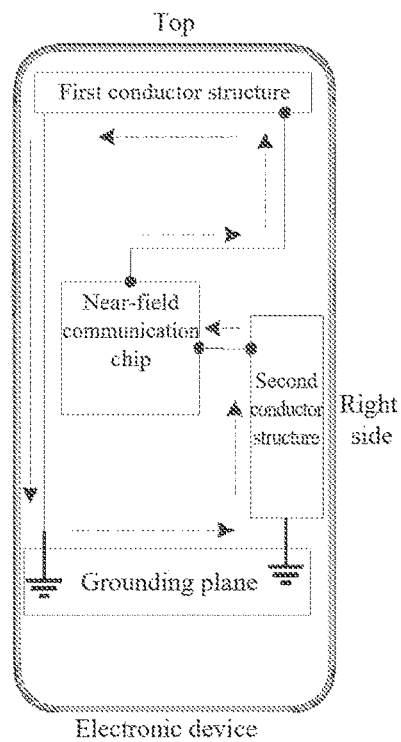
FIG. 6 is a schematic diagram of an arrangement of the antenna apparatus, shown in FIG. 2, in an electronic device.

Referring to FIG. 6 simultaneously, FIG. 6 is a schematic diagram of an arrangement of the antenna apparatus, shown in FIG. 2, in an electronic device.

The near-field communication chip (NFC chip) can be integrated on the circuit board of the electronic device. The first conductor structure can be disposed at one end of the electronic device, for example, the first conductor structure can be disposed at the top of the electronic device. The grounding plane can be formed on the circuit board of the electronic device. The second conductor structure may be disposed on one side of the electronic device, for example, the second conductor structure may be disposed on the right side of the electronic device. Therefore, the differential excitation current provided by the NFC chip can be transmitted from the NFC chip to the first conductor structure at the top of the electronic device, and then transmitted from the first conductor structure to the grounding plane on the circuit board of the electronic device, and then transmitted from the grounding plane on the circuit board to the second conductor structure on the right side of the electronic device, and finally flow back into the NFC chip.

It should be noted that the first conductor structure disposed on the top of the electronic device and the second conductor structure disposed on the right side of the electronic device are merely examples and are not intended to limit the embodiments of the present disclosure. It can be understood that the first conductor structure can also be disposed in other portions of the electronic device, and the second conductor structure can also be disposed in other portions of the electronic device, so that the NFC communication can be performed with other electronic devices via different parts of the electronic device.

For example, the NFC communication can also be realized via the front of the electronic device (i.e., a surface where the display screen of the electronic device is located), and the NFC communication can also be realized via the back of the electronic device (i.e., a surface where the battery cover of the electronic device is located).

It should be noted that when the electronic device radiates an NFC signal, the NFC chip in the electronic device can actively provide the differential excitation current. When the electronic device acts as an NFC receiver to receive NFC signals radiated by other electronic devices, the antenna apparatus in the electronic device can generate an induced current, wherein the induced current can also be understood as the differential excitation current provided by the NFC chip, or understood as the differential excitation current passively provided by the NFC chip. Namely, whether the electronic device acts as an NFC transmitter to radiate NFC signals or acts as an NFC receiver to receive NFC signals radiated by other electronic devices, the NFC chip in the electronic device can provide the differential excitation current.

In the antenna apparatus provided by the embodiments of the present disclosure, two conductor structures are arranged in the antenna apparatus, and the two conductor structures are connected to two different grounding points on the same grounding plane, and the ground plane between the two ground points forms a conductive path, so that a conductive loop for transmitting the NFC differential excitation current can be formed through the two conductor structures and the conductive path. Because the two conductor structures can be disposed in different parts of the electronic device according to the requirements of the internal space design of the electronic device, and then a loop is formed by connecting the conductive path formed on the grounding plane. Therefore, the design of the NFC antenna can be realized by the conductor structure in different parts of the electronic device and the grounding plane, so that a space occupied by the NFC antenna can be saved, and a layout of the NFC antenna can be more flexible.

Figure 7:
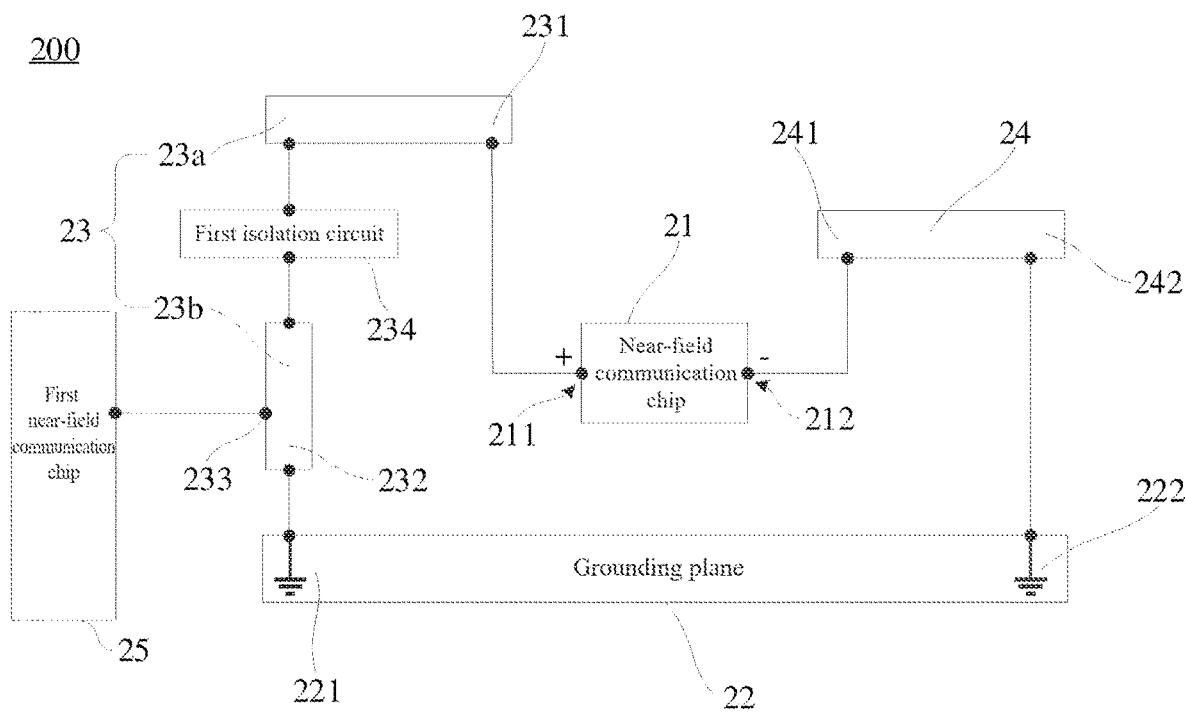
FIG. 7 is a schematic diagram of a second structure of an antenna apparatus provided by an embodiment of the present disclosure.

Referring to FIG. 7, that is a schematic diagram of a second structure of an antenna apparatus 200 provided by an embodiment of the present disclosure.

The first conductor structure 23 includes spaced a first conductor segment 23a and a second conductor segment 23b. Both the first conductor segment 23a and the second conductor segment 23b may be metal structures in the electronic device 100 or structures such as metal wiring on a circuit board. It should be noted that the material, shape, and size of the first conductor segment 23a and the second conductor segment 23b may be the same or different. The first conductor segment 23a and the second conductor segment 23b are disposed at different positions of the electronic device 100.

The first conductor segment 23a is electrically connected to the second conductor segment 23b through a first isolation circuit 234. Namely, an electrical connection between the first conductor segment 23a and the second conductor segment 23b is realized by the first isolation circuit 234. The first feeding terminal 231 of the first conductor structure 23 is disposed on the first conductor segment 23a. The first grounding terminal 232 of the first conductor structure 23 is disposed on the second conductor segment 23b.

Referring to FIG. 5, the middle frame 201 of the electronic device 100 may include a first metal branch 2011, a second metal branch 2012, and a third metal branch 2013 that are disposed apart from each other.

For example, a plurality of slits may be formed on the middle frame 201, and the first metal branch 2011, the second metal branch 2012, and the third metal branch 2013 may be formed by the plurality of slits. The first conductor segment 23a includes the first metal branch 2011, the second conductor segment 23b includes the second metal branch 2012, and the second conductor structure 24 includes the third metal branch 2013. Alternatively, the first conductor segment 23a includes the first metal branch 2011, the second conductor segment 23b includes the second metal branch 2012, and the second conductor structure 24 includes the printed circuit 31 provided on the circuit board 30. Alternatively, the first conductor segment 23a includes the first metal branch 2011, the second conductor segment 23b includes the second metal branch 2012, and the second conductor structure 24 includes the metal wiring 51 provided on the flexible circuit board 50.

It can be understood that the first conductive loop for transmitting the differential excitation current provided by the NFC chip 21 can be jointly formed by the first conductor segment 23a, the second conductor segment 23b, the conductive path on the grounding plane 22, and the second conductor structures 24. When the first conductive loop transmits the differential excitation current, all of the first conductor segment 23a, the second conductor segment 23b, and the second conductor structure 24 can transmit the differential excitation current, so that NFC signals are outward radiated.

It can be understood that when the first conductive loop transmits the differential excitation current, the first NFC radiation field generated by the first conductor structure 23 may include a first radiation sub-field and a second radiation sub-field. The first conductor segment 23*a* is used to generate the first radiation sub-field, and the second conductor segment 23*b* is used to generate the second radiation sub-field. The first radiation sub-field and the second radiation sub-field at least partially overlap. Therefore, the area of the NFC radiation field around the electronic device 100 can be further enhanced, and the field strength of the overlapping area can be enhanced. Therefore, the effective read/write (card swipe) area of the NFC antenna of the electronic device 100 can be increased, so as to improve the stability of the NFC antenna of the electronic device 100 during read/write (card swipe).

In addition, the antenna apparatus 200 further includes a first non-near-field communication chip 25. The first non-near-field communication chip 25 may be disposed on the circuit board 30 of the electronic device 100.

The first non-near-field communication chip 25 is used to provide a first non-near-field communication excitation signal. The first non-near-field communication excitation signal is an unbalanced signal. The first non-near-field communication excitation signal may include one of a cellular network signal, a wireless fidelity signal (Wi-Fi signal), a global positioning system signal (GPS signal), and a Bluetooth signal (BT signal). Correspondingly, the first non-near-field communication chip 25 may be a cellular communication chip for providing cellular network signals; the first non-near-field communication chip 25 may be a Wi-Fi chip for providing Wi-Fi signals; the first non-near-field communication chip 25 may be a GPS chip for providing GPS signals; the first non-near-field communication chip 25 may also be a BT chip for providing BT signals.

A third feeding terminal 233 is provided on the second conductor segment 23*b*. The third feeding terminal 233 is electrically connected to the first non-near-field communication chip 25, and the first non-near-field communication chip 25 is grounded. Therefore, the first non-near-field communication chip 25 can feed the first non-near-field communication excitation signal to the second conductor segment 23*b* via the third feeding terminal 233. Therefore, the second conductor segment 23*b* can also be used to transmit the first non-near-field communication excitation signal. Namely, the second conductor segment 23*b* forms a second conductive loop for transmitting the first non-near-field communication excitation signal.

The first isolation circuit 234 is used to realize the isolation between the differential excitation current transmitted through the first conductive loop and the first non-near-field communication excitation signal transmitted through the second conductive loop, for reducing or preventing mutual interference between the differential excitation current and the first non-near-field communication excitation signal during transmission.

The first isolation circuit 234 may include, for example, one or more inductors or one or more capacitors, or may also include a circuit composed of one or more inductors and one or more capacitors connected in series or in parallel.

It can be understood that the antenna apparatus 200 provided in this embodiment of the present disclosure includes the first conductor structure 23 and the second conductor structure 24, wherein the first conductor structure 23 includes the first conductor segment 23*a* and the second conductor segment 23*b*. The first conductor structure 23 and the second conductor structure 24 are connected to two different grounding points of the same grounding plane 22, and the grounding plane between the two grounding points is used to form the conductive path, so that the first conductor segment 23*a*, the second conductor segment 23*b*, the conductive path, and the ground plane 22 jointly form the first conductive loop for transmitting the NFC differential excitation current, and the second conductor segment 23*b* also forms the second conductive loop for transmitting the first non-near-field communication excitation signal. Because the first conductor segment 23*a*, the second conductor segment 23*b*, and the second conductor structure 24 can be respectively arranged in different parts of the electronic device according to the requirements of the internal space design of the electronic device, and then a loop is formed by connecting the conductive path formed on the grounding plane 22. Therefore, not only the design of the NFC antenna can be realized, but also the multiplexing of the second conductor segment 23*b* can be realized, by using the conductor structures in different parts of the electronic device to cooperate with the grounding plane, so that the space occupied by the antenna in the electronic device can be saved, and the layout of the antenna can be made more flexible.

Figure 8:
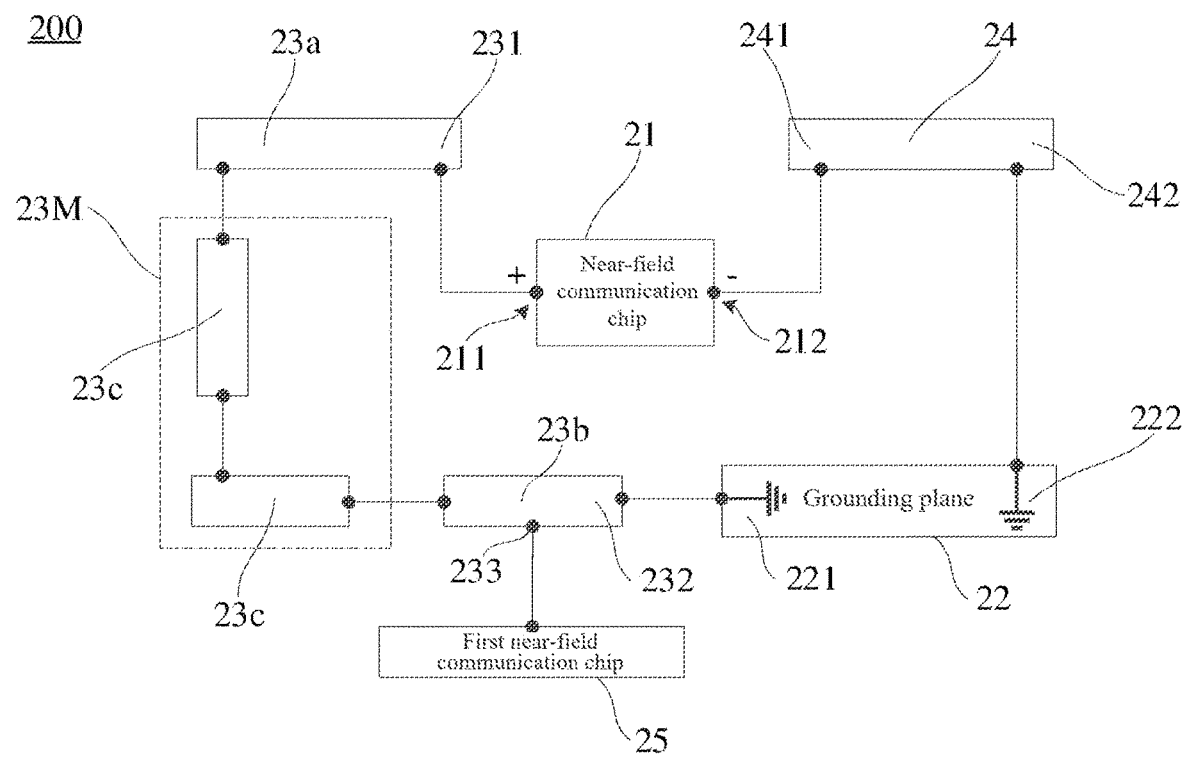
FIG. 8 is a schematic diagram of a third structure of an antenna apparatus provided by an embodiment of the present disclosure.

Referring to FIG. 8, that is a schematic diagram of a third structure of an antenna apparatus 200 according to an embodiment of the present disclosure.

The first conductor structure 23 further includes one or more third conductor segments 23*c*.

For example, the first conductor structure 23 may include two third conductor segments 23*c* shown in FIG. 8. The one or more third conductor segments 23*c* are sequentially electrically connected to form a third conductor segment set 23M. It can be understood that the third conductor segment set 23M may include two opposite ends. When the number of the third conductor segment 23*c* is one, the two opposite ends of the third conductor segment set 23M are the two opposite ends of the third conductor segment 23*c*; when the number of the third conductor segments 23*c* is two or more, the two opposite ends of the third conductor segment set 23M are first and last ends of the two or more third conductor segments 23*c* which are electrically connected in sequence.

The third conductor segment set 23M is disposed between the first conductor segment 23*a* and the first isolation circuit 234. One end of the third conductor segment set 23M is electrically connected to the first conductor segment 23*a*, and the other end of the third conductor segment set 23M is electrically connected to the first isolation circuit 234. Therefore, the first conductor segment 23*a* can be electrically connected to the second conductor segment 23*b* through the third conductor segment set 23M and the first isolation circuit 234.

It can be understood that the first conductive loop for transmitting the differential excitation current provided by the NFC chip 21 may be jointly formed by the first conductor segment 23*a*, the one or more third conductor segments 23*c*, the second conductor segment 23*b*, the conductive path on the grounding plane 22, and the second conductor structure 24. When the first conductive loop transmits the differential excitation current, all of the first conductor segment 23*a*, each of the third conductor segments 23*c*, the second conductor segment 23*b*, and the second conductor structure 24 can transmit the differential excitation current, so that the NFC signal is outward radiated.

Because the first conductor structure 23 includes one or more third conductor segments 23c, and each third conductor segment 23c can be arranged in different positions of the electronic device 100, when the first conductor structure 23 is arranged in a limited inner space of the electronic device 100, the arrangement can be more flexible, so the flexibility of disposing the NFC antenna in the electronic device 100 can be further improved.

Figure 9:
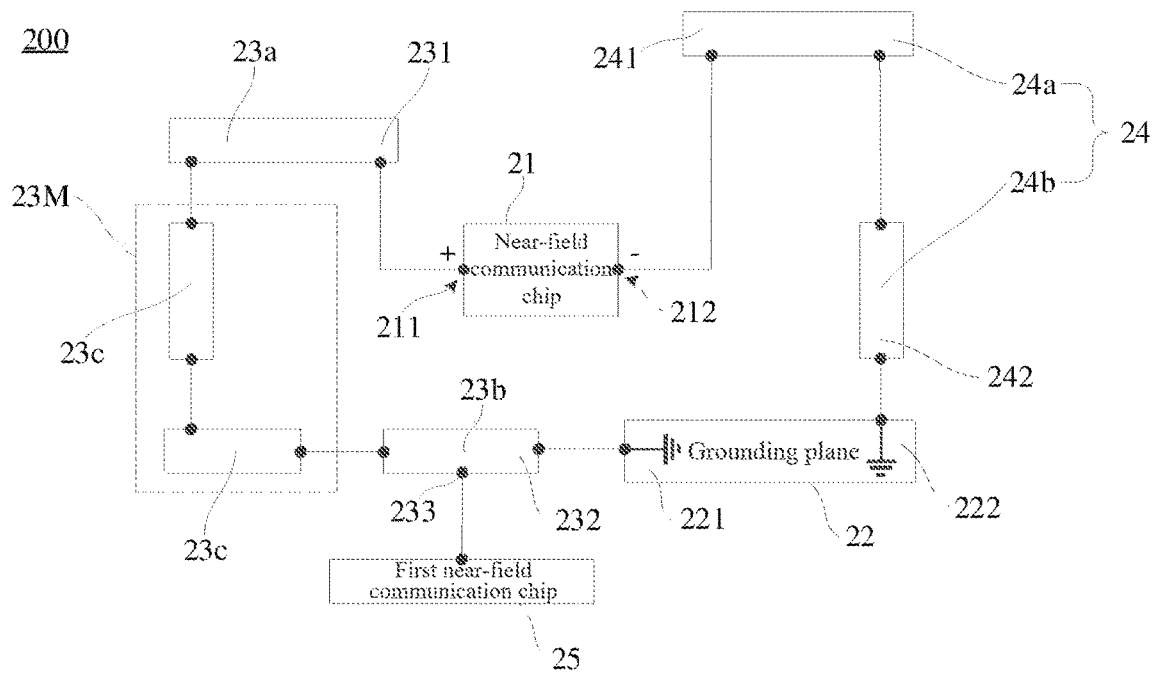
FIG. 9 is a schematic diagram of a fourth structure of an antenna apparatus provided by an embodiment of the present disclosure.

Referring to FIG. 9, that is a schematic diagram of a fourth structure of an antenna apparatus 200 provided by an embodiment of the present disclosure.

The second conductor structure 24 includes a fourth conductor segment 24a and a fifth conductor segment 24b, that are disposed apart from each other. Both the fourth conductor segment 24a and the fifth conductor segment 24b may be metal structures in the electronic device 100 or structures such as metal traces on a circuit board. It should be noted that the material, shape, and size of the fourth conductor segment 24a and the fifth conductor segment 24b may be the same or different. The fourth conductor segment 24a and the fifth conductor segment 24b are disposed at different positions of the electronic device 100.

The fourth conductor segment 24a is electrically connected to the fifth conductor segment 24b.

For example, the fourth conductor segment 24a and the fifth conductor segment 24b may also be electrically connected in the form of wires, printed circuits, or metal domes. The second feeding terminal 241 of the second conductor structure 24 is disposed on the fourth conductor segment 24a. The second grounding terminal 242 of the second conductor structure 24 is disposed on the fifth conductor segment 24b.

It can be understood that the first conductive loop for transmitting the differential excitation current provided by the NFC chip 21 can be jointly formed by the first conductor structure 23, the conductive path on the grounding plane 22, the fourth conductor segment 24a, and the fifth conductor segments 24b. When the first conductive loop transmits the differential excitation current, all of the first conductor structure 23, the fourth conductor segment 24a, and the fifth conductor segment 24b can transmit the differential excitation current and can radiate the NFC signal outward to make the arrangement of the second conductor structure 24 more flexible.

In addition, it can be understood that because the second conductor structure 24 includes two conductor segments, i.e., the fourth conductor segment 24a and the fifth conductor segment 24b, the entire length of the second conductor structure 24 is sufficient to radiate the NFC signal outward. When the length of each conductor segment is required, the length of each conductor segment can be set shorter. Namely, the lengths of the fourth conductor segment 24a and the fifth conductor segment 24b can be set shorter, thereby making the arrangement of the second conductor structure 24 in the electronic device 100 more flexible.

Figure 10:
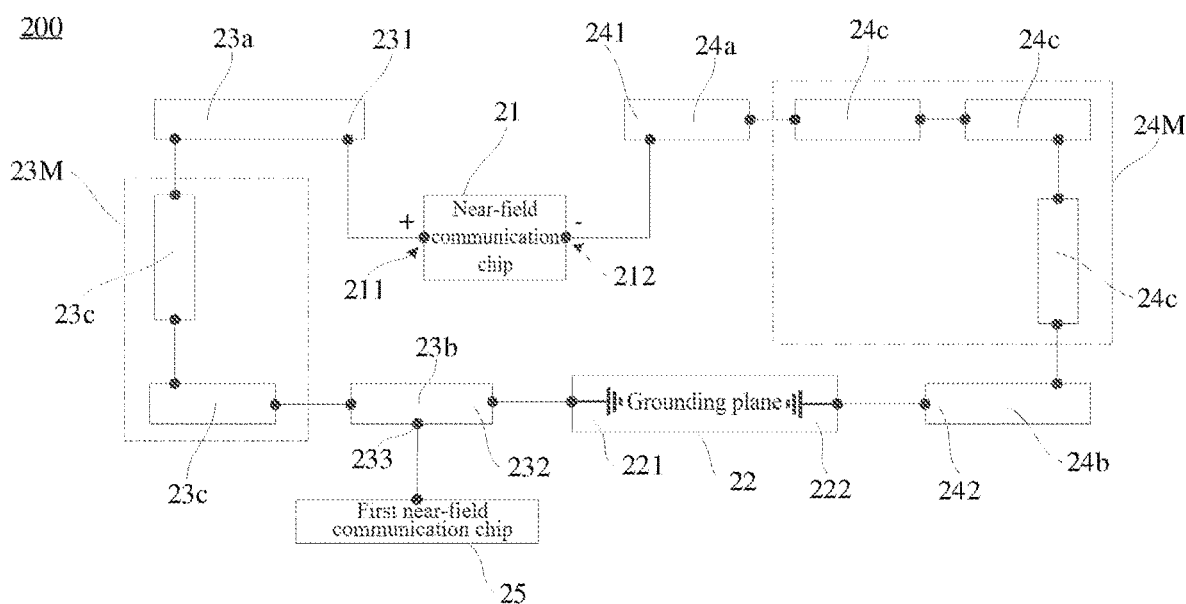
FIG. 10 is a schematic diagram of a fifth structure of an antenna apparatus provided by an embodiment of the present disclosure.

Referring to FIG. 10, that is a schematic diagram of a fifth structure of an antenna apparatus 200 provided by an embodiment of the present disclosure.

The second conductor structure 24 further includes one or more sixth conductor segments 24c.

For example, the second conductor structure 24 may include the three sixth conductor segments 24c shown in FIG. 10. The one or more sixth conductor segments 24c are sequentially electrically connected to form a sixth conductor segment set 24M. It can be understood that the sixth conductor segment set 24M may include two opposite ends. When the number of the sixth conductor segment 24c is one, the two opposite ends of the sixth conductor segment set 24M are the two opposite ends of the sixth conductor segment 24c. When the number of the sixth conductor segments 24c is two or more, the two opposite ends of the sixth conductor segment set 24M are the first and last ends of the two or more sixth conductor segments 24c that are electrically connected in sequence.

One end of the sixth conductor segment set 24M is electrically connected to the fourth conductor segment 24a, and the other end of the sixth conductor segment set 24M is electrically connected to the fifth conductor segment 24b, so that the fourth conductor segment 24a, the sixth conductor segment set 24M, and the fifth conductor segment 24b are electrically connected in sequence. Therefore, the fourth conductor segment 24a can be electrically connected to the fifth conductor segment 24b through the sixth conductor segment set 24M.

It can be understood that the first conductive loop for transmitting the differential excitation current provided by the NFC chip 21 may be jointly formed by the first conductor structure 23, the conductive path on the grounding plane 22, the fourth conductor segment 24a, the one or more sixth conductor segments 24c, and the fifth conductor segment 24b. When the first conductive loop transmits the differential excitation current, all of the first conductor structure 23, the fourth conductor segment 24a, each of the sixth conductor segment 24c, and the fifth conductor segment 24b can transmit the differential excitation current and can radiate the NFC signal outward to make the arrangement of the second conductor structure 24 more flexible.

Because the second conductor structure 24 includes one or more sixth conductor segments 24c, and each sixth conductor segment 24c can be arranged in different positions of the electronic device 100, when the second conductor structure 24 is arranged in the limited inner space of the electronic device 100, the arrangement can be more flexible, so the flexibility of disposing the NFC antenna in the electronic device 100 can be further improved.

Figure 11:
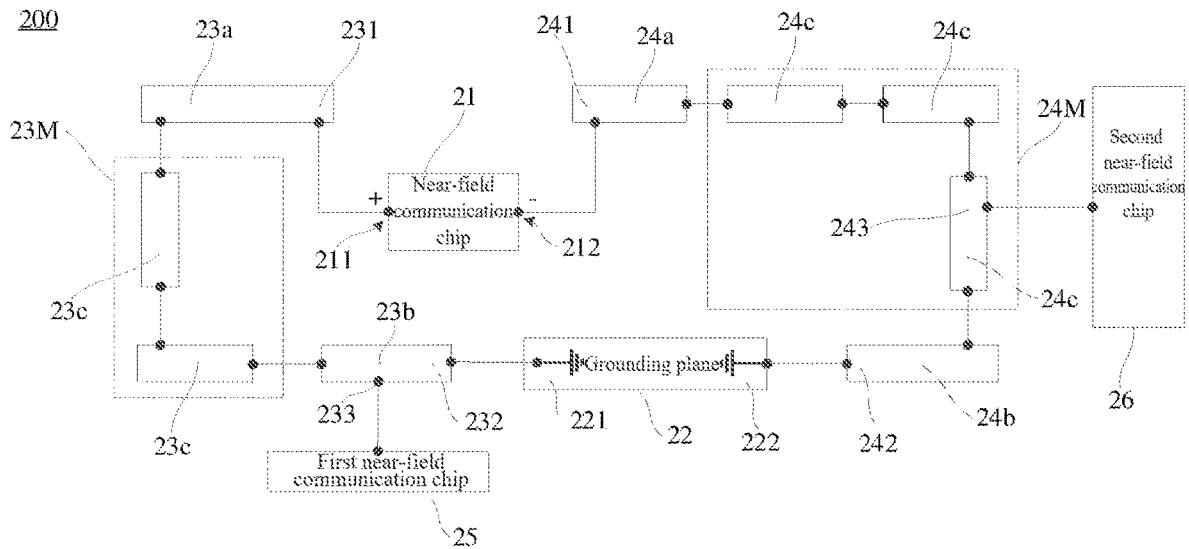
FIG. 11 is a schematic diagram of a sixth structure of an antenna apparatus provided by an embodiment of the present disclosure.

Referring to FIG. 11, that is a schematic diagram of a sixth structure of an antenna apparatus 200 provided by an embodiment of the present disclosure. The antenna apparatus 200 further includes a second non-near-field communication chip 26. It can be understood that the second non-near-field communication chip 26 may be disposed on the circuit board 30 of the electronic device 100.

The second non-near-field communication chip 26 is used for providing a second non-near-field communication excitation signal. The second non-near-field communication excitation signal is an unbalanced signal. The second non-near-field communication excitation signal may include one of a cellular network signal, a wireless fidelity signal (Wi-Fi signal), a global positioning system signal (GPS signal), and a Bluetooth signal (BT signal). Correspondingly, the second non-near-field communication chip 26 may be a cellular communication chip for providing cellular network signals; the second non-near-field communication chip 26 may be a Wi-Fi chip for providing Wi-Fi signals; the second non-near-field communication chip 26 may be a GPS chip for providing GPS signals; the second non-near-field communication chip 26 may also be a BT chip for providing BT signals.

It should be noted that the second non-near-field communication excitation signal and the first non-near-field communication excitation signal may be signals of the same communication type or signals of different communication types. Correspondingly, the second non-near-field communication chip 26 and the first non-near-field communication chip 25 may be chips of the same type or chips of different types.

A fourth feeding terminal 243 is provided on the sixth conductor segment set 24M. When the sixth conductor segment set 24M includes one sixth conductor segment 24c, the fourth feeding terminal 243 may be disposed on the sixth conductor segment 24c. When the sixth conductor segment set 24M includes two or more sixth conductor segments 24c, the fourth feeding terminal 243 may be disposed on any one of the sixth conductor segments 24c.

The fourth feeding terminal 243 is electrically connected to the second non-near-field communication chip 26, and the second non-near-field communication chip 26 is grounded. Therefore, the second non-near-field communication chip 26 can feed the second non-near-field communication excitation signal to the sixth conductor segment set 24M via the fourth feeding terminal 243. Therefore, the sixth conductor segment set 24M and the fifth conductor segment 24b may be used to jointly transmit the second non-near-field communication excitation signal. Namely, the sixth conductor segment set 24M and the fifth conductor segment 24b jointly form a third conductive loop for transmitting the second non-near-field communication excitation signal.

It can be understood that a second isolation circuit may be provided between the sixth conductor segment set 24M and the fourth conductor segment 24a. The second isolation circuit is used to realize the isolation between the differential excitation current transmitted through the first conductive loop and the second non-near-field communication excitation signal transmitted through the third conductive loop, for reducing or preventing mutual interference between the differential excitation current and the second non-near-field communication excitation signal during transmission.

The second isolation circuit may include, for example, one or more inductors or one or more capacitors, or may also include a circuit composed of one or more inductors and one or more capacitors connected in series or in parallel.

It can be understood that the sixth conductor segment set 24M and the fifth conductor segment 24b can be used not only to transmit the differential excitation current provided by the NFC chip 21, but also to transmit the second non-near-field communication excitation signal provided by the second non-near-field communication chip 26, so that multiplexing the sixth conductor segment set 24M and the fifth conductor segment 24b can be realized, which can further reduce the number of the conductor structures used for transmitting wireless signals in the electronic device 100, so that the internal space of the electronic device 100 can be further saved.

Figure 12:
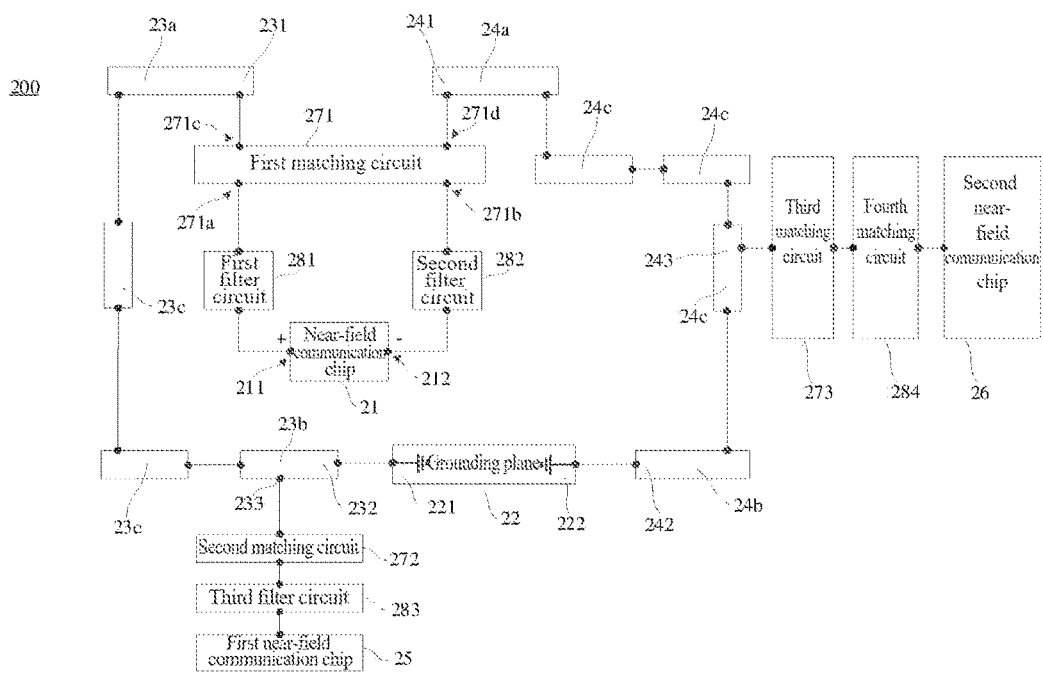
FIG. 12 is a schematic diagram of a seventh structure of an antenna apparatus provided by an embodiment of the present disclosure.

Referring to FIG. 12, that is a schematic diagram of a seventh structure of an antenna apparatus 200 provided by an embodiment of the present disclosure. The antenna apparatus 200 further includes a first matching circuit 271, a second matching circuit 272, a third matching circuit 273, a first filter circuit 281, a second filter circuit 282, a third filter circuit 283, and a fourth filter circuit 284. It can be understood that a matching circuit can also be referred to as a matching network, a tuning circuit, a tuning network, and the like. A filter circuit may also be referred to as a filter network.

The first matching circuit 271 is electrically connected to the first differential-signal terminal 211 of the NFC chip 21, the second differential-signal terminal 212 of the NFC chip 21, the first feeding terminal 231 of the first conductor structure 23, and the second feeding terminal 241 of the second conductor structure 24. The first matching circuit 271 is used to match impedance of the first conductive loop when transmitting the differential excitation current. The first conductive loop is the first conductive loop jointly formed by the first conductor structure 23, the conductive path on the grounding plane 22, and the second conductor structure 24.

The first matching circuit 271 includes a first input terminal 271a, a second input terminal 271b, a first output terminal 271c, and a second output terminal 271d. The first input terminal 271a is electrically connected to the first differential-signal terminal 211 of the NFC chip 21, the second input terminal 271b is electrically connected to the second differential-signal terminal 212 of the NFC chip 21, the first output terminal 271c is electrically connected to the first feeding terminal 231 of the first conductor structure 23, and the second output terminal 271d is electrically connected to the second feeding terminal 241 of the second conductor structure 24.

The first filter circuit 281 is disposed between the first differential-signal terminal 211 of the NFC chip 21 and the first input terminal 271a of the first matching network 271. The first filter circuit 281 is used for filtering out first interference signals between the first differential-signal terminal 211 and the first input terminal 271a. The first interference signals are electrical signals other than the differential excitation current provided by the NFC chip 21.

The second filter circuit 282 is disposed between the second differential-signal terminal 212 of the NFC chip 21 and the second input terminal 271b of the first matching circuit 271. The second filter circuit 282 is used for filtering out second interference signals between the second differential-signal terminal 212 and the second input terminal 271b. The second interference signals are electrical signals other than the differential excitation current provided by the NFC chip 21.

The second matching circuit 272 is electrically connected to the first non-near-field communication chip 25 and the third feeding terminal 233. The second matching circuit 272 is used to match impedance of the second conductive loop when transmitting the first non-near-field communication excitation signal.

The third filter circuit 283 is disposed between the first non-near-field communication chip 25 and the second matching circuit 272. The third filter circuit 283 is used to filter out third interference signals between the first non-near-field communication chip 25 and the second matching circuit 272. The third interference signals are electrical signals other than the first non-near-field communication excitation signal provided by the first non-near-field communication chip 25.

The third matching circuit 273 is electrically connected to the second non-near-field communication chip 26 and the fourth feeding terminal 243. The third matching circuit 273 is used for matching impedance of the second conductor structure 24 when transmitting the second non-near-field communication excitation signal. Specifically, the third matching circuit 273 is used to match impedance of the sixth conductor segment set 24M and the fifth conductor segment 24b when transmitting the second non-near-field communication excitation signal.

The fourth filter circuit 284 is disposed between the second non-near-field communication chip 26 and the third matching circuit 273. The fourth filter circuit 284 is used to filter out fourth interference signals between the second non-near-field communication chip 26 and the third matching circuit 273. The fourth interference signals are electrical signals other than the second non-near-field communication excitation signal provided by the second non-near-field communication chip 26.

It can be understood that each of the first matching circuit 271, the second matching circuit 272, and the third matching circuit 273 may include circuits composed of any series or any parallel connection of capacitors and inductors. Each of the first filter circuit 281, the second filter circuit 282, the third filter circuit 283, and the fourth filter circuit 284 may also include circuits composed of any series or any parallel connection of capacitors and inductors.

Figure 13:
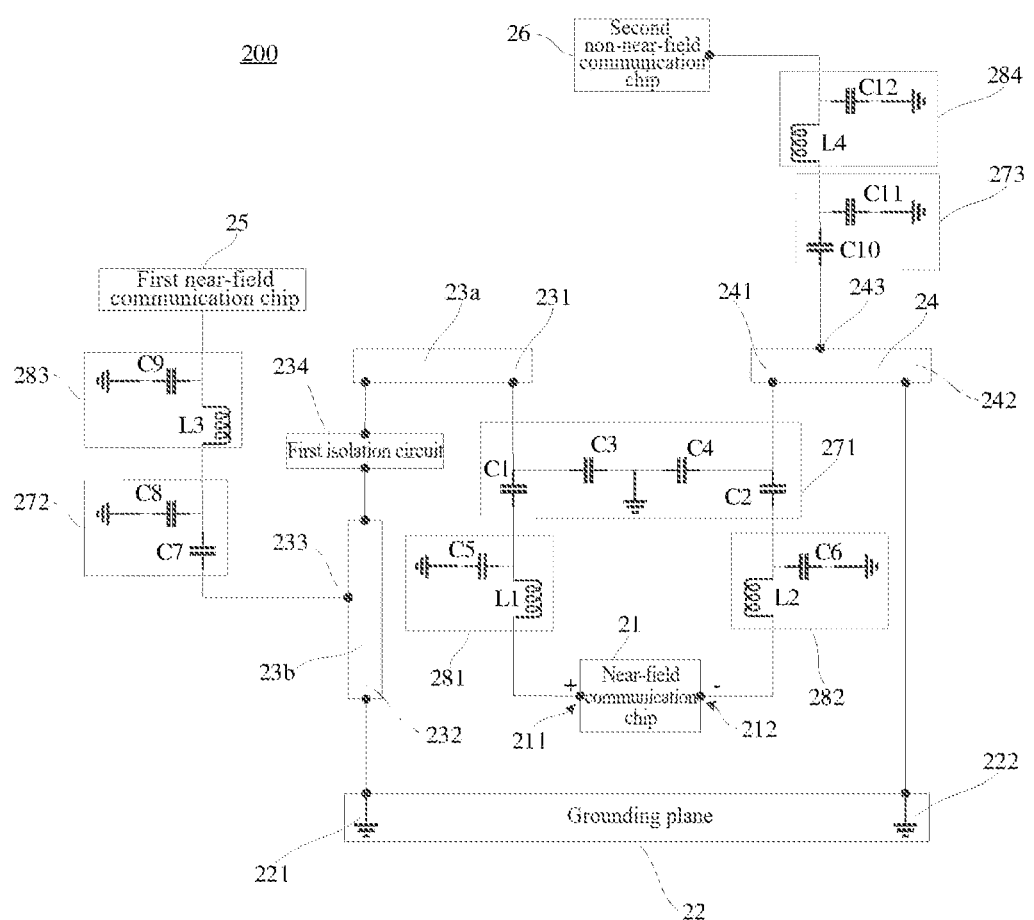
FIG. 13 is a schematic diagram of an eighth structure of an antenna apparatus provided by an embodiment of the present disclosure.

Referring to FIG. 13, that is a schematic diagram of an eighth structure of an antenna apparatus 200 provided by an embodiment of the present disclosure.

The first matching circuit 271 may include, for example, four capacitors C1, C2, C3, and C4. The capacitor C1 is connected in series with the first differential-signal terminal 211 of the NFC chip 21, and the capacitor C2 is connected in series with the second differential-signal terminal 212 of the NFC chip 21. The capacitor C3 is connected in series with the capacitor C4, and a connection in series of the capacitor C3 and the capacitor C4 is connected in parallel with the NFC chip 21, and a portion connecting between the capacitor C3 and the capacitor C4 is grounded. It can be understood that capacitance of each of the capacitors C1, C2, C3, and C4 can be set according to actual needs.

The first filter circuit 281 may include, for example, an inductor L1 and a capacitor C5. The inductor L1 is connected in series between the first differential-signal terminal 211 and the first matching circuit 271, and the capacitor C5 is connected in parallel with the NFC chip 21 and grounded. It can be understood that inductance of the inductor L1 and capacitance of the capacitor C5 can be set according to actual needs.

The second filter circuit 282 may include, for example, an inductor L2 and a capacitor C6. The inductor L2 is connected in series between the second differential-signal terminal 212 and the first matching circuit 271, and the capacitor C6 is connected in parallel with the NFC chip 21 and grounded. It can be understood that inductance of the inductor L2 and capacitance of the capacitor C6 can be set according to actual needs.

The second matching circuit 272 may include, for example, capacitors C7 and C8. The capacitor C7 is connected in series between the third feeding terminal 233 of the first conductor structure 23 and the first non-near-field communication chip 25. The capacitor C8 is connected in parallel with the first non-near-field communication chip 25 and grounded. It can be understood that capacitance of each of the capacitors C7 and C8 can be set according to actual needs.

The third filter circuit 283 may include, for example, an inductor L3 and a capacitor C9. The inductor L3 is connected in series between the first non-near-field communication chip 25 and the second matching circuit 272. The capacitor C9 is connected in parallel with the first non-near-field communication chip 25 and grounded. It can be understood that inductance of the inductor L3 and capacitance of the capacitor C9 can be set according to actual needs.

The third matching circuit 273 may include, for example, capacitors C10 and C11. The capacitor C10 is connected in series between the fourth feeding terminal 243 of the second conductor structure 24 and the second non-near-field communication chip 26. The capacitor C11 is connected in parallel with the second non-near-field communication chip 26 and grounded. It can be understood that capacitance of each of the capacitors C10 and C11 can be set according to actual needs.

The fourth filter circuit 284 may include, for example, an inductor L4 and a capacitor C12. The inductor L4 is connected in series between the second non-near-field communication chip 26 and the third matching circuit 273. The capacitor C12 is connected in parallel with the second non-near-field communication chip 26 and grounded. It can be understood that inductance of the inductor L4 and capacitance of the capacitor C12 can be set according to actual needs.

The antenna apparatus and the electronic device provided by the embodiments of the present disclosure are described in detail above. The principles and implementations of the present disclosure are described herein by using specific examples, and the descriptions of the above embodiments are only used to help the understanding of the present disclosure. Meanwhile, for those skilled in the art, according to the idea of the present application, there will be changes in the specific embodiments and application scope. In summary, the content of this specification should not be construed as a limitation to the present disclosure.

What is claimed is:
1. An antenna apparatus, comprising:
a near-field communication chip comprising a first differential-signal terminal and a second differential-signal terminal, wherein the first differential-signal terminal and the second differential-signal terminal are configured to provide a differential excitation current;
a first non-near-field communication chip configured to provide a first non-near-field communication excitation signal;
a grounding plane comprising a first grounding point and a second grounding point disposed apart from each other, wherein the grounding plane forms a conductive path between the first grounding point and the second grounding point;
a first conductor structure comprising a first conductor segment and a second conductor segment disposed apart from each other, wherein the first conductor segment is electrically connected to the second conductor segment through a first isolation circuit, the first conductor segment is provided with a first feeding terminal, the first feeding terminal is electrically connected to the first differential-signal terminal, the second conductor segment is provided with a third feeding terminal and a first grounding terminal, the third feeding terminal is connected to the first non-near-field communication chip, and the first grounding terminal is electrically connected to the first grounding point; and
a second conductor structure comprising a second feeding terminal and a second grounding terminal disposed apart from each other, wherein the second feeding terminal is electrically connected to the second differential-signal terminal, and the second grounding terminal is electrically connected to the second ground point;
wherein the first conductor structure, the conductive path, and the second conductor structure jointly form a first conductive loop for transmitting the differential excitation current, the second conductor segment further forms a second conductive loop for transmitting the first non-near-field communication excitation signal, the first isolation circuit is configured to implement isolation between the differential excitation current transmitted through the first conductive loop and the first non-near-field communication excitation signal transmitted through the second conductive loop.

2. The antenna apparatus as claimed in claim 1, wherein when the first conductive loop transmits the differential excitation current, the first conductor structure generates a first near-field-communication radiation field, the second conductor structure generates a second near-field-communication radiation field, and the second near-field-communication radiation field at least partially overlaps the first near-field-communication radiation field.

3. The antenna apparatus as claimed in claim 2, wherein the first near-field-communication radiation field comprises a first radiation sub-field and a second radiation sub-field, the first conductor segment is configured to generate the first radiation sub-field, the second conductor segment is configured to generate the second radiation sub-field, and the first radiation sub-field at least partially overlaps the second radiation sub-field.

4. The antenna apparatus as claimed in claim 2, wherein the grounding plane generates a third near-field-communication radiation field, the third near-field-communication radiation field at least partially overlaps the first near-field-communication radiation field, and the third near-field-communication radiation field at least partially overlaps the second near field communication radiation field.

5. The antenna apparatus as claimed in claim 1, wherein the first conductor structure further comprises one or more third conductor segments, the one or more third conductor segments are electrically connected in sequence to form a third conductor segment set, one end of the third conductor segment set is electrically connected to the first conductor segment, the other end of the third conductor segment set is electrically connected to the first isolation circuit, and the first conductor segment is electrically connected to the second conductor segment through the third conductor segment set and the first isolation circuit.

6. The antenna apparatus as claimed in claim 1, wherein the second conductor structure includes a fourth conductor segment and a fifth conductor segment apart from each other, the fourth conductor segment is electrically connected to the fifth conductor segment, the second feeding terminal is disposed on the fourth conductor segment, and the second grounding terminal is disposed on the fifth conductor segment.

7. The antenna apparatus as claimed in claim 6, wherein the second conductor structure further comprises one or more sixth conductor segments, the one or more sixth conductor segments are electrically connected in sequence to form a sixth conductor segment set, one end of the sixth conductor segment set is electrically connected to the fourth conductor segment, the other end of the sixth conductor segment set is electrically connected to the fifth conductor segment, and the fourth conductor segment is electrically connected to the fifth conductor segment through the sixth conductor segment set.

8. The antenna apparatus as claimed in claim 7, further comprising:
a second non-near-field communication chip configured to provide a second non-near-field communication excitation signal;
wherein the sixth conductor segment set is provided with a fourth feeding terminal, the fourth feeding terminal is electrically connected to the second non-near-field communication chip, a second isolation circuit is provided between the sixth conductor segment set and the fourth conductor segment, the sixth conductor segment set and the fifth conductor segment jointly form a third conductive loop for transmitting the second non-near-field communication excitation signal, and the second isolation circuit is configured to implement isolation between the differential excitation current transmitted through the first conductive loop and the second non-near field communication excitation signal transmitted through the third conductive loop.

9. The antenna apparatus as claimed in claim 1, further comprising a first matching circuit, wherein the first matching circuit is connected to the first differential-signal terminal, the second differential-signal terminal, the first feeding terminal, and the second feeding terminal, and the first matching circuit is configured to match impedance of the first conductive loop when transmitting the differential excitation current.

10. The antenna apparatus as claimed in claim 9, wherein the first matching circuit comprises a first input terminal, a second input terminal, a first output terminal, and a second output terminal; and
the first input terminal is electrically connected to the first differential-signal terminal, the second input terminal is electrically connected to the second differential-signal terminal, the first output terminal is electrically connected to the first feeding terminal, and the second output terminal is electrically connected to the second feeding terminal.

11. The antenna apparatus as claimed in claim 10, further comprising:
a first filter circuit disposed between the first differential-signal terminal and the first input terminal; and
a second filter circuit disposed between the second differential-signal terminal and the second input terminal.

12. The antenna apparatus as claimed in claim 1, further comprising a second matching circuit, wherein the second matching circuit is electrically connected to the first non-near-field communication chip and the third feeding terminal, and the second matching circuit is configured to match impedance of the second conductive loop when transmitting the first non-near-field communication excitation signal.

13. The antenna apparatus as claimed in claim 12, further comprising a third filter circuit disposed between the first non-near-field communication chip and the second matching circuit.

14. The antenna apparatus as claimed in claim 8, further comprising a third matching circuit, wherein the third matching circuit is electrically connected to the second non-near-field communication chip and the fourth feeding terminal, and the third matching circuit is configured match impedance of the third conductive loop when transmitting the second non-near-field communication excitation signal.

15. The antenna apparatus as claimed in claim 14, further comprising a fourth filter circuit disposed between the second non-near-field communication chip and the third matching circuit.

16. An electronic device comprising an antenna apparatus, wherein the antenna apparatus comprises:
a near-field communication chip comprising a first differential-signal terminal and a second differential-signal terminal, wherein the first differential-signal terminal and the second differential-signal terminal are configured to provide a differential excitation current;
a first non-near-field communication chip configured to provide a first non-near-field communication excitation signal;
a grounding plane comprising a first grounding point and a second grounding point disposed apart from each other, wherein the grounding plane forms a conductive path between the first grounding point and the second grounding point;

a first conductor structure comprising a first conductor segment and a second conductor segment disposed apart from each other, wherein the first conductor segment is electrically connected to the second conductor segment through a first isolation circuit, the first conductor segment is provided with a first feeding terminal, the first feeding terminal is electrically connected to the first differential-signal terminal, the second conductor segment is provided with a third feeding terminal and a first grounding terminal, the third feeding terminal is connected to the first non-near-field communication chip, and the first grounding terminal is electrically connected to the first grounding point; and a second conductor structure comprising a second feeding terminal and a second grounding terminal disposed apart from each other, wherein the second feeding terminal is electrically connected to the second differential-signal terminal, and the second grounding terminal is electrically connected to the second ground point;

wherein the first conductor structure, the conductive path, and the second conductor structure jointly form a first conductive loop for transmitting the differential excitation current, the second conductor segment further forms a second conductive loop for transmitting the first non-near-field communication excitation signal, the first isolation circuit is configured to implement isolation between the differential excitation current transmitted through the first conductive loop and the first non-near-field communication excitation signal transmitted through the second conductive loop.

17. The electronic device as claimed in claim 16, further comprising a circuit board, wherein each of the near-field communication chip, the first non-near-field communication chip, and the grounding plane is disposed on the circuit board.

18. The electronic device as claimed in claim 17, further comprising a middle frame, wherein the circuit board is disposed on the middle frame, the middle frame comprises a first metal branch, a second metal branch, and a third metal branch A metal branch that are spaced apart from each other, the first conductor segment comprises the first metal branch, the second conductor segment comprises the second metal branch, and the second conductor structure comprises the third metal branch.

19. The electronic device as claimed in claim 17, wherein a printed circuit is provided on the circuit board, and the second conductor structure comprises the printed circuit.

20. The electronic device as claimed in claim 17, further comprising a flexible circuit board, wherein the flexible circuit board is electrically connected to the circuit board, the flexible circuit board is provided with metal wiring, and the second conductor structure comprises the metal wiring.

* * * * *